(12) United States Patent
Steffens

(10) Patent No.: US 6,711,185 B2
(45) Date of Patent: Mar. 23, 2004

(54) POLARIZATION DEPENDENT OUT-COUPLING

(75) Inventor: Wolf Steffens, Herrenberg (DE)

(73) Assignee: Agilent Technologies, Inc., Palo Alto, CA (US)

( * ) Notice: Subject to any disclaimer, the term of this patent is extended or adjusted under 35 U.S.C. 154(b) by 27 days.

(21) Appl. No.: 09/997,770

(22) Filed: Nov. 30, 2001

(65) Prior Publication Data

US 2002/0172241 A1 Nov. 21, 2002

(30) Foreign Application Priority Data

May 15, 2001 (EP) .............................. 01111721

(51) Int. Cl.[7] .............................. H01S 3/10; H01S 3/08
(52) U.S. Cl. .......................... 372/27; 372/71; 372/101; 372/106; 372/108
(58) Field of Search ............................ 372/27, 106, 20, 372/68, 15, 16, 53, 63, 71, 70, 75, 93, 101, 108

(56) References Cited

U.S. PATENT DOCUMENTS

| | | | |
|---|---|---|---|
| 5,499,134 A | 3/1996 | Galvabauskas et al. ..... | 359/333 |
| 5,511,086 A | 4/1996 | Su ............................... | 372/31 |
| 5,812,567 A | 9/1998 | Jeon et al. ..................... | 372/6 |

OTHER PUBLICATIONS

Jobst, B., Examiner. European Search Report Application No. EP 01 11 1721, dated Sep. 25, 2001.

*Primary Examiner*—Paul Ip
*Assistant Examiner*—Armando Rodriguez

(57) ABSTRACT

An optical arrangement for direction dependent coupling out of light comprises a first and a second polarization converter each for converting the state of polarization of light received in a predetermined way. A polarization dependent coupling device is adapted for coupling out a portion of the light received, whereby the ratio of the coupled out portion substantially depends on the state of polarization of the light received. The polarization dependent coupling device is arranged between the first and the second polarization converters, and the optical arrangement receives from different sides light beams propagating in different directions. The characteristics of the first and the second polarization converters are adapted such that the polarization dependent coupling device receives light beams propagating with different states of polarization in the different directions.

10 Claims, 4 Drawing Sheets

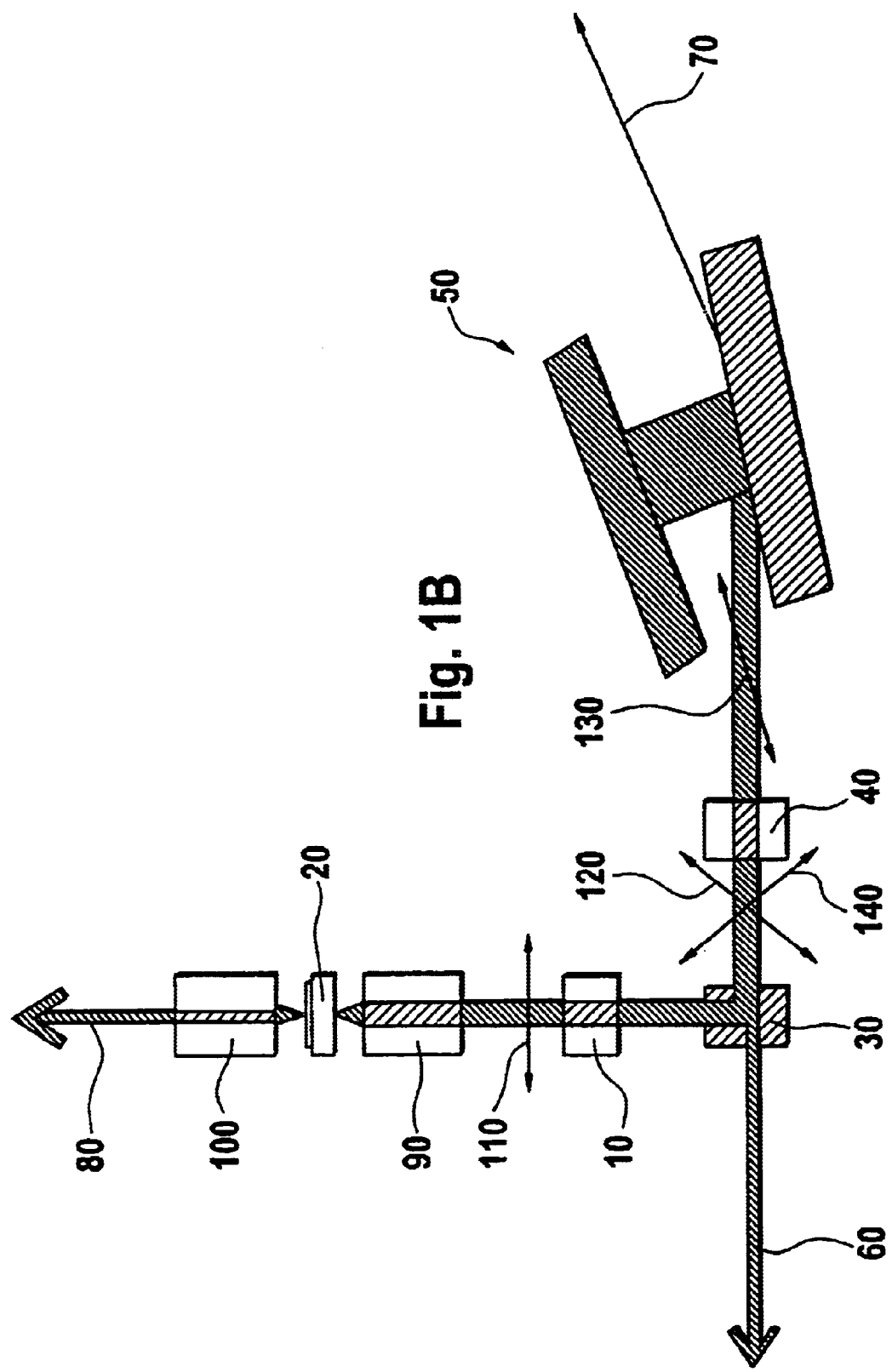

POLARIZATION DEPENDENT OUT-COUPLING

BACKGROUND OF THE INVENTION

1. Field of the Invention

The present invention relates to coupling out light e.g. from a laser cavity.

2. Discussion of the Background Art

Today, most DWDM component test systems for high dynamic range are based on a tunable laser source (TLS) that uses a low source spontaneous emission (SSE) optical output. A laser beam may have an improved signal to noise ratio (SNR), if it is coupled out just behind a wavelength selective device as disclosed e.g. in EP-A-921614. Such output shall be referred to the following as "Low-SSE output".

SUMMARY OF THE INVENTION

It is an object of the invention to further improve optical laser systems where light is coupled out, preferably in cavity systems to deliver maximum output power at minimum SSE. The object is solved by the independent claims. Preferred embodiments are shown by the dependent claims.

The main problem when using a beam splitter as an output coupler in a cavity arrangement is that not only the desired beam (e.g. the Low-SSE output) from one direction will be coupled out but also a comparable amount of light propagating in the other direction is coupled out on the opposite side of the beam splitter. This 'undesired' output might be utilized or not, but will nevertheless weaken the laser's performance.

The present invention provides a tool allowing to direction sensitive coupling out light, so that light travelling in different directions can be coupled out with different coupling ratios.

According to the invention, a direction sensitive coupling out of light is provided by an out-coupling arrangement having a first polarization converter, a polarization dependent coupling device, and a second polarization converter.

In operation when a first light beam propagating in a first direction is coupled to the out-coupling arrangement, the first light beam having a first state of polarization is launched to the first polarization converter for converting the first state of polarization in a first way to a second state of polarization. The first light beam with the second state of polarization is then launched to the polarization dependent coupling device, such as a polarization dependent beam splitter. The polarization dependent coupling device is provided for coupling out a portion of its incoming light beam, whereby the portion of the coupled out light is defined by the state of polarization of the incoming light beam. Dependent on the second state of polarization, a portion of the first light beam will be coupled out by the polarization dependent coupling device as a first output beam. The remaining portion of the first light beam is launched to the second polarization converter for converting the second state of polarization in a second way to a third state of polarization.

In operation when a second light beam propagating in a second direction different to the first direction is coupled to the out-coupling arrangement, the second light beam having a fourth state of polarization is launched to the second polarization converter for converting the fourth state of polarization in the second way to a fifth state of polarization. The second light beam with the fifth state of polarization is then launched to the polarization dependent coupling device coupling out a portion of the second light beam as second output beam dependent on the fifth state of polarization. The remaining portion of the second light beam is launched to the first polarization converter converting the fifth state of polarization in the first way to a sixth state of polarization.

Thus, it becomes clear that the coupling ratios for the first and second output beams can be defined by adjusting and/or modifying at least one of the parameters: the polarization dependent coupling ratio of the polarization dependent coupling device, the first and fourth states of polarization, and the first and second polarization conversion ways provided by the first and second polarization converters.

In a preferred embodiment, wherein the first and second light beams are each linearly polarized, the first and second polarization converters are provided as polarization rotators. The first polarization rotator rotates the first state of polarization by a first rotation angle to the second state of polarization. Dependent on the second state of polarization, a portion of the first light beam will be coupled out by the polarization dependent coupling device as the first output beam, and the remaining portion of the first light beam is launched to the second polarization rotator for rotating the second state of polarization by a second rotation angle to the third state of polarization.

Accordingly, the second polarization rotator rotates the fourth state of polarization of the second light beam by the second rotation angle to the fifth state of polarization. The polarization dependent coupling device couples out a portion of the second light beam as the second output beam dependent on the fifth state of polarization. The remaining portion of the second light beam is launched to the first polarization rotator rotating the fifth state of polarization by the first rotation angle to the sixth state of polarization.

The coupling ratios for the first and second output beams can thus be defined by adjusting the polarization dependent coupling ratio of the polarization dependent beam splitter to the first and fourth states of polarization and correspondingly defining the first and second rotation angles.

In a preferred embodiment, the invention is employed in a cavity structure wherein light is travelling in two (opposite) directions between two end points. In case that the state of polarization is substantially maintained when returning from such end point, the first and the sixth state of polarization substantially match. Accordingly, the third and the fourth state of polarization will also match substantially. The first and second rotation angles are preferably both selected to be 45°, so that the state of polarization of the light in each direction is turned by 90° in total. Thus, the fourth state of polarization is 90° different from the first state of polarization, or in other words, the state of polarization of the incoming first light beam is 90° different from the state of polarization of the incoming second light beam (from the other side).

Due to the first and second rotation angles to be 45°, the polarization dependent beam splitter will receive light beams in the different directions with 90° difference in the state of polarization.

The polarization dependent beam splitter is preferably designed to provide two functions. The first function, as explained above, is the 'standard' function of a polarization dependent beam splitter, i.e. to divide the incoming light into a first portion having a first state of polarization and into a second portion having a second state of polarization with 90° difference to the first state of polarization. The second function is of a 'normal' beam splitter, i.e. to divide a light beam into two portion with a given ratio between the portions. This second function can be added to a 'standard' polarization dependent beam splitter (providing only the first function) e.g. by providing adequate material coatings on the beam splitting surfaces. Combining those two functions allows achieving a polarization dependent beam splitter transmitting the portion of the incoming light having the first state of polarization and coupling out only a part of the portion of the incoming light having the second state of polarization (with 90° difference to the first state of polarization), while the other part of the portion of the incoming light having the second state of polarization will be transmitted in the same way as the portion of the incoming light having the first state of polarization. A given coupling ratio determines the ratio between the two parts of the portion of the incoming light having the second state of polarization. The coupling ratio is preferably designed to be substantially smaller than 100%, e.g. in a range of 10–30%, so that only that ratio of the portion (e.g. in the range of 10–30%) of the incoming light having the second state of polarization will be coupled out. Such 'two functions' polarization dependent beam splitter is in particular useful in cavity or monitoring applications, so that only a (preferably smaller) portion of a main beam will be coupled out.

In a further preferred embodiment, the coupling ratio (for coupling out only a portion of the portion of the incoming light having a certain state of polarization) of the 'two functions' polarization dependent beam splitter is designed to be different dependent on the direction of the incoming light. This can be achieved by providing different material coatings e.g. on opposite sides of the beam splitting surfaces.

In one embodiment, the coupling ratio for one direction of the incoming light (and having a defined state of polarization due to the described polarization converter arrangement) is adjusted to a desired value (e.g. maximal outcoupling of a portion but significantly less than 100%, preferably in a range of 10–30%), while the coupling ratio for the other direction (with 90° difference in the state of polarization) of the incoming light is minimal, preferably substantially zero. Thus, light travelling in one direction can be coupled out with maximum coupling ratio while light travelling in the other direction will (substantially) not be coupled out. However, other outcoupling ratios for the different directions can also be applied accordingly.

In a preferred embodiment, the inventive out-coupling arrangement comprised of the polarization dependent coupling device coupled between the first and second polarization converters is applied in an external cavity of a wavelength tunable laser. The wavelength tunable laser comprises a laser medium, preferably a semiconductor laser, and a wavelength dependent filter. The inventive out-coupling arrangement is preferably arranged close to the wavelength dependent filter in a way that a portion of the light returning from the wavelength dependent filter is coupled out with the maximum coupling ratio while light travelling to the wavelength dependent filter is not coupled out or only with the minimum coupling ratio. Thus, a high purity output beam can be provided without 'wasting' a further and unwanted coupled out beam as in conventional beam splitter arrangements.

Each of the polarization converters can be preferably embodied by a Faraday rotator as known in the art.

A retarder (preferably a λ/4 plate) can also be applied e.g. for the second polarization converter generating a circularly polarized output when receiving linearly polarized light from one direction. In case the retarder receives (from the other direction) also circularly polarized light, however with opposite sense of rotation, the retarder will again convert this to linearly polarized light with 90°-phase shift with respect to the input of the retarder from the one side. In case that a reflecting device (such as a mirror) is applied e.g. for converting the first light beam into the second light beam, the circular polarization will be substantially maintained, however with opposite senses of direction.

It goes without saying that the inventive out-coupling arrangement is not limited to applications wherein the first fourth states of polarization of the first and second light beams are (maintained) constant. The inventive out-coupling will work also for varying states of polarization and/or mixtures of linear and circular polarized light, whereby the out-coupling (ratios) might then be subject to such variation or depend on the mixing ratio.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference sign(s).

FIGS. 1A and 1B illustrate in schematic view the present invention applied in an example of a high power and low SSE external cavity laser.

DETAILED DESCRIPTION OF THE INVENTION

Figure 1A:
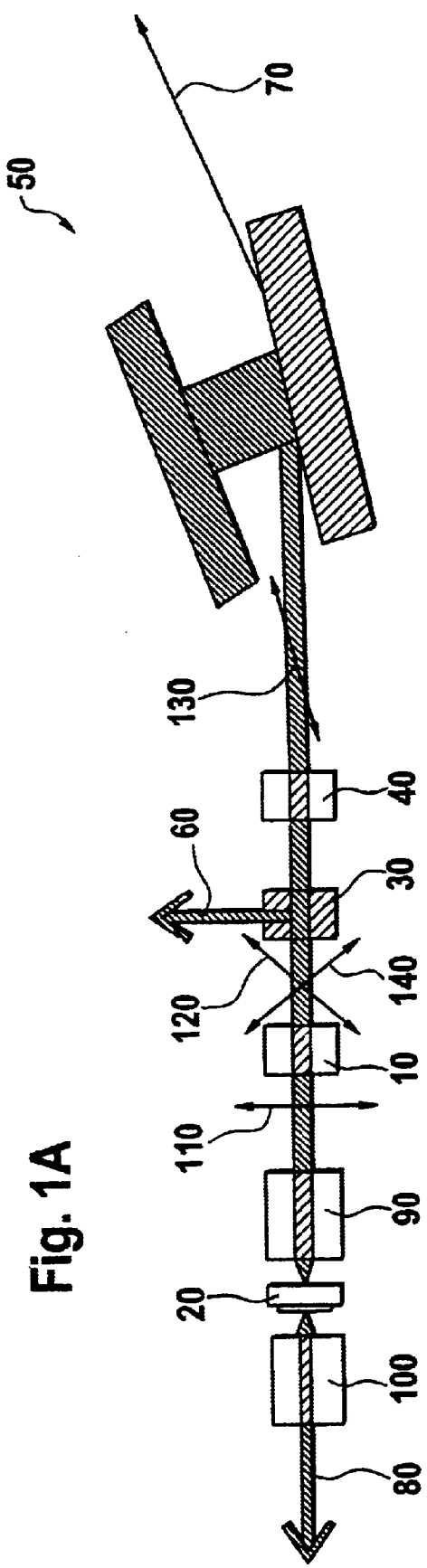

In FIG. 1A, a first polarization rotator 10 (preferably a λ/4 retarder) is used to rotate the polarization of a light beam emanating from a laser chip 20 to 45°. A polarizing beam splitter 30 is adjusted in such way that all light (from the direction of the laser chip 20) is transmitted. A second polarization rotator 40 (also preferably a λ/4 retarder) rotates the polarization to 90° with respect to the beam from the laser chip 20. Returning from a wavelength tunable filter 50, the light again traverses the polarization rotator 40. Now, on the way back from polarization rotator 40 to beam splitter 30, the polarization at the beam splitter 30 is perpendicular to the light propagating from polarization rotator 10, so that the polarizing beam splitter 30 couples out (as an output beam 60) only a portion of the light coming in the direction from the wavelength tunable filter 50. After passing the first polarizing rotator 10 again, the polarization of the light which is feed back to the laser chip has the original orientation.

Dependent on the configuration and design of the laser cavity, another output 70 can be derived from the wavelength tunable filter 50 and/or a further output 80 can be derived by providing a partly transparent back facet for the laser chip 20. Collimating lenses 90 and 100 might be provided for collimating light emitted from the laser chip 20.

The states of polarization in the arrangement of FIG. 1A are illustrated for the example of vertically polarized light 110 emitted from the laser chip 20. The first polarization rotator 10 rotates the polarization by 45° (arrow 120). The polarizing beam splitter 30 is adjusted that all light with polarization of arrow 120 is transmitted. The second polarization rotator 40 rotates the polarization again by 45° (arrow 130) so that the beam travelling to the wavelength tunable filter 50 becomes horizontally polarized.

In case the wavelength tunable filter 50 does not (substantially) change the state of polarization, the polarization of the light returning from the wavelength tunable filter 50 to the second polarization rotator 40 still has the horizontal polarization of arrow 130. The second polarization rotator 40 again rotates the polarization by 45° (arrow 140), so that the state of polarization 140 of the light returning from the wavelength tunable filter 50 at the beam splitter 30 is perpendicular with respect to the state of polarization 120 of the light from the laser chip 20. The polarizing beam splitter 30 couples out (as the output beam 60) a portion of the light with the state of polarization 140. After passing the first polarizing rotator 10 again, the polarization of the light which is feed back to the laser chip 20 has the original orientation 110, e.g., vertical polarization.

The embodiment of FIG. 1B only distinguishes from FIG. 1A in that the beam splitter 30 is arranged in a way that the output beam 60 is provided by the beam transmitting the beam splitter 30, while the beam reflected by the beam splitter 30 is maintained in the cavity. This illustrates that the term 'opposite directions' should not be understood in its literal meaning but has to be interpreted in a broader sense and in the context of the respective embodiment.

Figure 2:
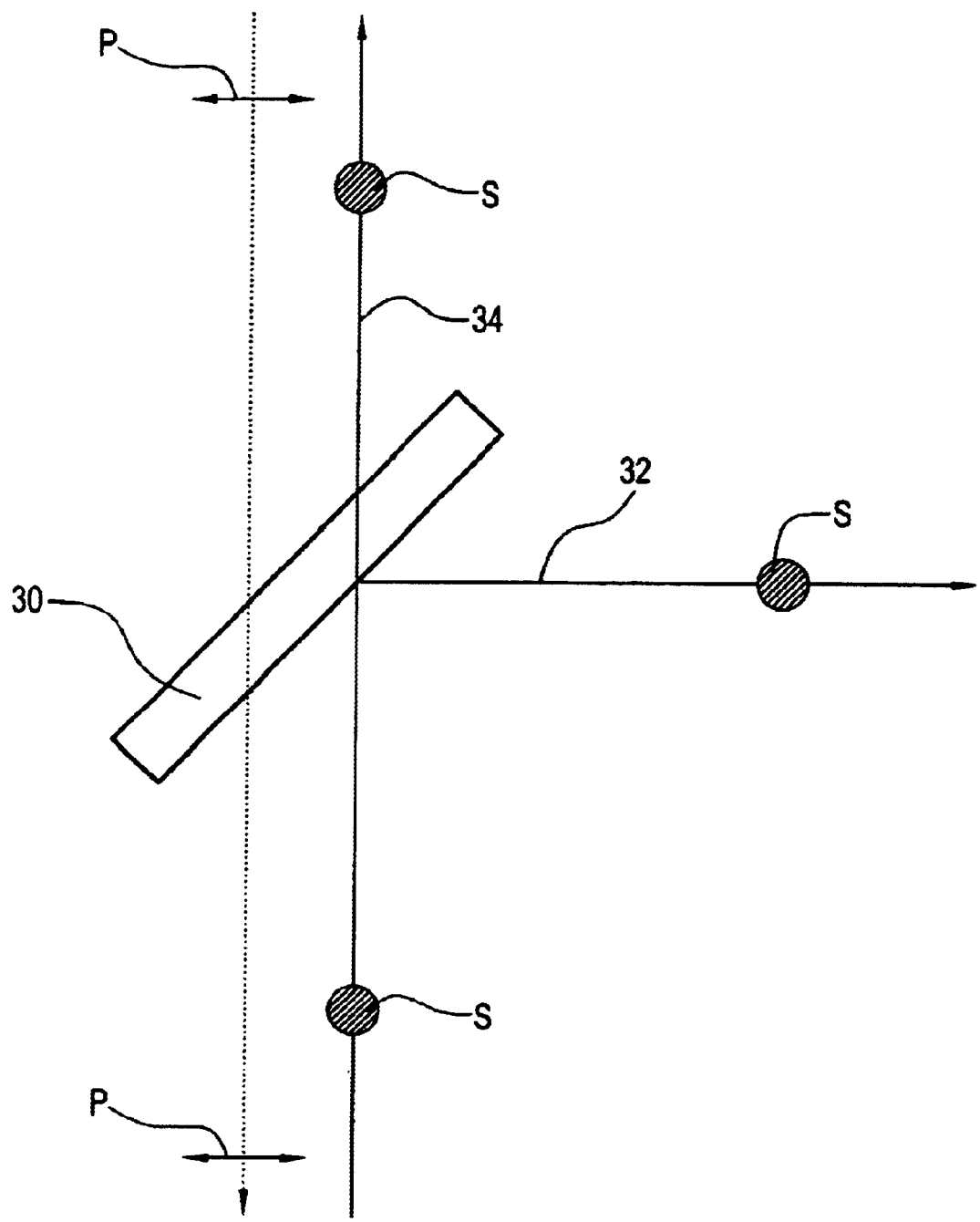
FIG. 2 illustrates properties of the polarization dependent beam splitter.

The properties of the beam splitter 30 are shown in FIG. 2. An incident beam with a state of polarization P is transmitted with low attenuation. A beam having a polarization S perpendicular to P is propagating from the opposite direction and reflected partially. This reflected beam is coupled out as a sub-portion 32 and can be used e.g. as Low-SSE output. The other part of the beam is transmitted through the beam splitter 30 as a sub-portion 34 and fed back into the laser chip 20.

Figure 3:
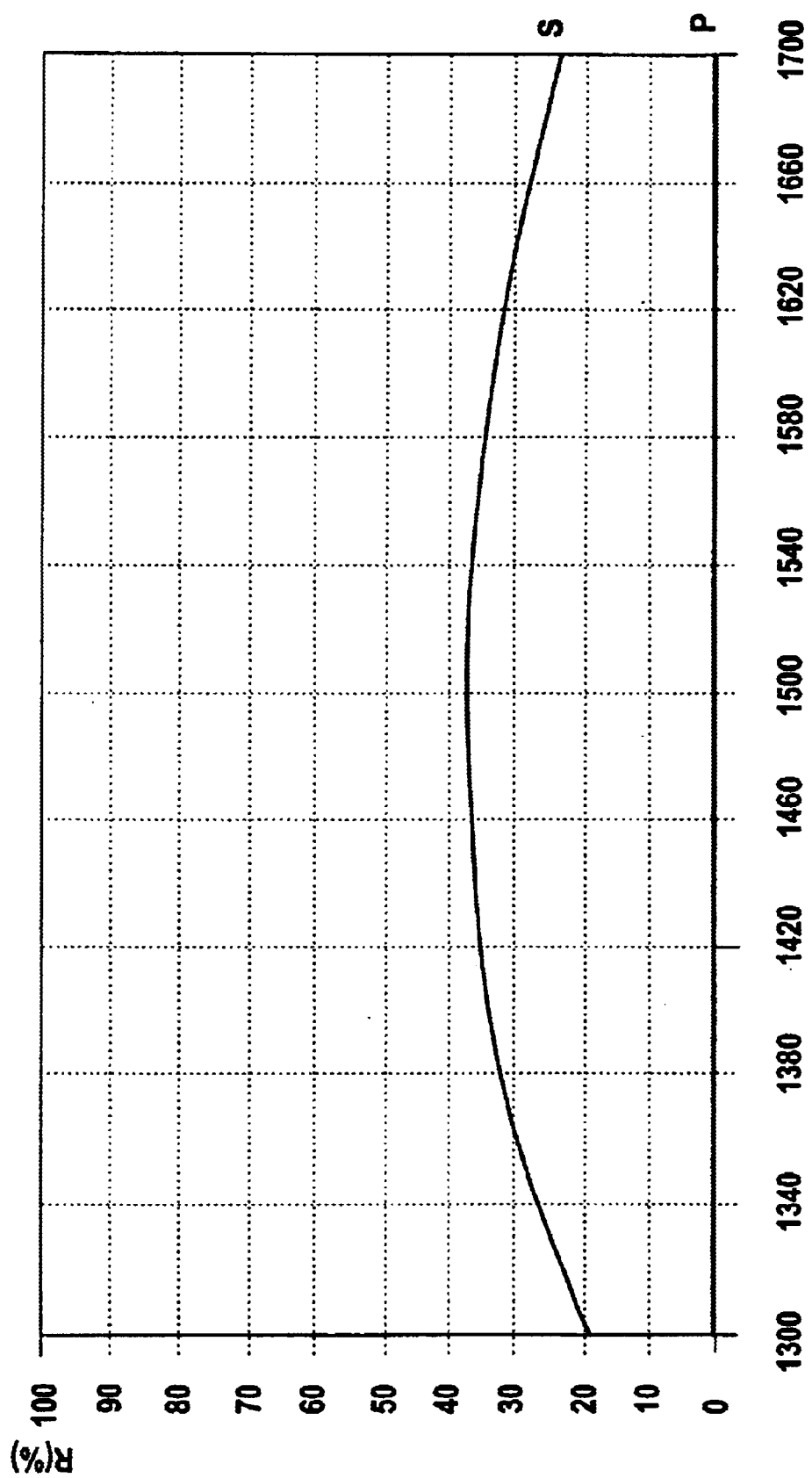
FIG. 3 depicts a further performance improvement by providing a wavelength dependent reflection for the polarization dependent beam splitter 30.

Performance of the optical output power of the output beam 60 may be further improved by adjusting the characteristic of the polarizing beam splitter 30 with respect to the gain characteristic of the laser chip 20, as described in detail in U.S. Pat. No. 5,434,874. The tuning range as well as the output power of the external cavity laser may be significantly increased by applying a coating that has a wavelength dependent reflectivity R substantially matching the gain characteristic of the laser chip 20. An example of such improved beam splitter 30 characteristic is shown in FIG. 3. This wavelength dependent output coupling enhances the optical output power at the edges of the laser-tuning curve without adversely affecting the output power at the center wavelengths. This further increases the tuning range of the laser while simultaneously maintaining high output power for each selected output wavelenth.

What is claimed is:

1. A wavelength tunable laser source comprising:
   a laser medium for producing light;
   a filter that receives the light and is tunable in wavelength to filter the light; and
   an optical arrangement in an optical path between the laser medium and the filter, wherein said optical arrangement includes:
   a first polarization converter for converting a state of polarization of the light received by the first polarization converter in a first way;
   a second polarization converter for converting a state of polarization of the light received by the second polarization converter in a second way; and
   a polarization dependent coupling device, between the first polarization converter and the second polarization converter, for coupling out a portion of the light received by the coupling device, and having a coupling ratio that substantially depends on a state of polarization of the light received by the coupling device,
   wherein the optical arrangement receives, from different sides, beams of the light propagating in different directions, and
   wherein the polarization dependent coupling device receives beams of the light propagating with different states of polarization in the different directions, such that (a) a first portion of the light returning from the filter is coupled out and (b) a second portion of the light propagating to the filter is coupled out, wherein the first portion is greater than the second portion.

2. The wavelength tunable laser source of claim 1, wherein the first polarization converter is for turning the state of polarization by a first rotation angle, and the second polarization converter is for turning the state of polarization by a second rotation angle.

3. The wavelength tunable laser source of claim 2, wherein the first and the second rotation angles are about 45°.

4. The wavelength tunable laser source of claim 1, wherein the polarization dependent coupling device comprises a polarization dependent beamsplitter.

5. The wavelength tunable laser source of claim 1, wherein the polarization dependent coupling device is for substantially fully transmitting the light with a first state of polarization while coupling out a maximum portion of the light with a state of polarization perpendicular to the first state of polarization.

6. The wavelength tunable laser source of claim 1, wherein the polarization dependent coupling device is for dividing the light into a first portion having a first state of polarization and into a second portion having a second state of polarization with about 90° difference to the first state of polarization.

7. The wavelength tunable laser source of claim 6, wherein the polarization dependent coupling device is for dividing at least one of (a) the first portion into two first sub portions with a given first coupling ratio between the two first sub portions, and (b) the second portion into two second sub portions with a given second coupling ratio between the two second sub portions.

8. The wavelength tunable laser source of claim 7, wherein at least one of the first or second coupling ratio is in a range of about 10%–30%.

9. The wavelength tunable laser source of claim 7, wherein the polarization dependent coupling device is for transmitting the portion of the incoming light having the first state of polarization and coupling out only about 10%–30% of the portion of the light having the second state of polarization, while the other part of the portion of the light having the second state of polarization will be transmitted in the same way as the portion of the light having the first state of polarization.

10. The wavelength tunable laser source of claim 7, wherein the coupling ratio depends on the direction of the light.

* * * * *